(12) United States Patent
Ishiguro et al.

(10) Patent No.: US 10,971,286 B2
(45) Date of Patent: Apr. 6, 2021

(54) THERMAL-INSULATED MULTI-WALLED PIPE FOR SUPERCONDUCTING POWER TRANSMISSION

(71) Applicant: JFE STEEL CORPORATION, Tokyo (JP)

(72) Inventors: Yasuhide Ishiguro, Tokyo (JP); Akio Sato, Tokyo (JP); Shigeto Sakashita, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 0 days.

(21) Appl. No.: 16/614,800

(22) PCT Filed: May 29, 2018

(86) PCT No.: PCT/JP2018/020584
§ 371 (c)(1),
(2) Date: Nov. 19, 2019

(87) PCT Pub. No.: WO2018/221523
PCT Pub. Date: Dec. 6, 2018

(65) Prior Publication Data
US 2020/0203042 A1 Jun. 25, 2020

(30) Foreign Application Priority Data
May 31, 2017 (JP) .............................. JP2017-107847

(51) Int. Cl.
*H01B 12/14* (2006.01)
*F16L 59/065* (2006.01)
*F16L 58/02* (2006.01)

(52) U.S. Cl.
CPC .............. *H01B 12/14* (2013.01); *F16L 58/02* (2013.01); *F16L 59/065* (2013.01)

(58) Field of Classification Search
CPC . F16L 58/02; F16L 58/04; F16L 58/08; F16L 59/065; H01B 12/14
See application file for complete search history.

(56) References Cited

U.S. PATENT DOCUMENTS

2005/0194178 A1 9/2005 Xin et al.
2017/0130874 A1* 5/2017 Watanabe ............... B32B 15/18

FOREIGN PATENT DOCUMENTS

CN 1664963 A 9/2005
CN 100367420 C 2/2008
(Continued)

OTHER PUBLICATIONS

Jan. 14, 2020, Notification of Reasons for Refusal issued by the Japan Patent Office in the corresponding Japanese Patent Application No. 2018-544576 with English language concise statement of relevance.
(Continued)

*Primary Examiner* — Timothy J Thompson
*Assistant Examiner* — Amol H Patel
(74) *Attorney, Agent, or Firm* — Kenja IP Law PC (57) ABSTRACT

Provided is a thermal-insulated multi-walled pipe for superconducting power transmission that highly prevents intrusion of external heat due to radiation and has excellent thermal insulation property without using a superinsulation and can be produced easily. A thermal-insulated multi-walled pipe for superconducting power transmission comprises: a superconducting cable; and a multi-walled pipe that houses the superconducting cable, wherein the multi-walled pipe is composed of a plurality of straight pipes, and at least one of the plurality of straight pipes has, at a surface thereof, a coating layer containing a metal powder.

9 Claims, 2 Drawing Sheets (56) References Cited

FOREIGN PATENT DOCUMENTS

| JP | S59157195 U | 10/1984 | | |
|---|---|---|---|---|
| JP | S6164442 A | 4/1986 | | |
| JP | S61270593 A | 11/1986 | | |
| JP | H10316445 A | 12/1998 | | |
| JP | 2000002396 A | * | 1/2000 | ............. F16L 58/04 |
| JP | 2000002396 A | | 1/2000 | |
| JP | 2007080649 A | * | 3/2007 | ............ H01B 12/14 |
| JP | 2007080649 A | | 3/2007 | |
| JP | 2014146585 A | | 8/2014 | |
| JP | 2017078202 A | | 4/2017 | |

OTHER PUBLICATIONS

Aug. 7, 2018, International Search Report issued in the International Patent Application No. PCT/JP2018/020584.

Jun. 25, 2019, Notification of Reasons for Refusal issued by the Japan Patent Office in the corresponding Japanese Application No. 2018-544576 with English language Concise Statement of Relevance Patent.

Jul. 20, 2020, Office Action issued by the China National Intellectual Property Administration in the corresponding Chinese Patent Application No. 201880035374.3 with English language search report.

Apr. 22, 2020, the Extended European Search Report issued by the European Patent Office in the corresponding European Patent Application No. 18809951.9.

* cited by examiner

THERMAL-INSULATED MULTI-WALLED PIPE FOR SUPERCONDUCTING POWER TRANSMISSION

TECHNICAL FIELD

The present disclosure relates to a thermal-insulated multi-walled pipe for superconducting electric power transmission (a thermal-insulated multiple pipe for superconducting electric power transmission), and particularly relates to a thermal-insulated multi-walled pipe for superconducting power transmission that highly prevents intrusion of external heat due to radiation and has excellent thermal (heat) insulation property.

BACKGROUND

Superconductivity is a phenomenon in which, when a metal, an alloy, or the like is cooled, its electric resistance rapidly decreases to zero at a specific temperature. Applications of superconductivity are studied in various fields. In particular, superconducting power transmission, i.e., power transmission using a cable in a superconducting state, is proceeding toward practical utilization as a power transmission method with no power loss during power transmission.

In superconducting power transmission, to maintain a cable in a superconducting state, the cable needs to be constantly cooled. Hence, the use of a thermal-insulated multi-walled pipe is proposed. In the thermal-insulated multi-walled pipe, a cable of a superconducting material is placed in the innermost pipe (inner pipe) of the multi-walled pipe, and a coolant such as liquid nitrogen is flown into the inner pipe. Here, in the case where a large amount of heat intrudes the thermal-insulated multi-walled pipe from the external environment of the thermal-insulated multi-walled pipe, a larger cooling unit is required in order to maintain the superconducting state, and the running cost increases. Various measures are therefore taken to prevent intrusion of external heat in the thermal-insulated multi-walled pipe.

First, a vacuum insulation layer is provided by decompressing the space between adjacent two pipes (inner pipe and outer pipe) of the plurality of pipes constituting the multi-walled pipe. By providing the vacuum insulation layer, the intrusion of heat through the air in the pipe can be prevented.

Further, a spacer made of a low thermal conductive material such as a resin is placed between the adjacent two pipes, as described in JP 2007-080649 A (PTL 1). By providing the spacer, the adjacent pipes are kept from being in direct contact with each other, and thus intrusion of external heat from the contact portion by thermal conduction can be prevented.

By use of the vacuum insulation layer and the spacer together, both heat intrusion through the air and through direct contact between pipes can be prevented. However, it is known that heat intrusion into the thermal-insulated multi-walled pipe is caused not only by these factors but also by radiation of far-infrared rays or the like.

A known method of reducing heat intrusion due to radiation is a method using a thermal insulator called a superinsulation (SI). A superinsulation is also referred to as multilayer insulation (MLI), and, for example, has a structure in which aluminum vapor-deposited resin films are stacked. By covering the surface of the inner pipe with this superinsulation, heat intrusion due to radiation from outside can be prevented.

The use of the superinsulation, however, has the following problems. First, when laying the thermal-insulated multi-walled pipe for superconducting power transmission for actual power transmission, welding and cutting are usually performed in order to adjust the length of the thermal-insulated multi-walled pipe. Sparks emitted during such operation ignite the superinsulation, and cause fire or damage the thermal-insulated multi-walled pipe for superconducting power transmission. Moreover, in the case of forming the vacuum insulation layer by decompressing the space where the superinsulation is located, the time required for the decompression increases due to "gas components" derived from the gas present in the superinsulation, which is a multilayer film, and from water and organic material adsorbed to the film.

In view of this, PTL 1 proposes providing a metal coating at the surfaces of the pipes constituting the thermal-insulated multi-walled pipe, instead of the superinsulation. The use of the metal coating can prevent intrusion of external heat due to radiation.

CITATION LIST

Patent Literature

PTL 1: JP 2007-080649 A

SUMMARY

Technical Problem

With the method using the metal coating proposed in PTL 1, an intrusion of external heat due to radiation can be prevented to improve the thermal insulation property of the thermal-insulated multi-walled pipe for superconducting power transmission to some extent. The metal coating in PTL 1, however, is formed by hot-dip coating, electroplating, sputtering, or vapor deposition, and thus requires a large-scale production line.

Moreover, in the case where the metal coating needs to be repaired on the site when laying the superconducting power transmission line, it is difficult to perform coating, vapor deposition, or the like on the site. Consequently, the thermal-insulated multi-walled pipe is used in a state in which the metal coating is partially missing, and heat intrusion from the part cannot be prevented.

Furthermore, when laying the thermal-insulated multi-walled pipe for superconducting power transmission, a plurality of thermal-insulated multi-walled pipes are typically connected by welding on the site of the laying or the like. Alternatively, the plurality of thermal-insulated multi-walled pipes is temporarily assembled by welding at the factory or the like beforehand. Heat during such welding may cause the metal coating of the weld to be lost or change in quality. In order to ensure the mechanical properties of the weld, a technique of removing the metal coating of the surface to be welded across a width of, for example, several millimeters to several tens of millimeters beforehand is also employed in some cases. In these cases, the heat intrusion prevention effect by the metal coating cannot be exerted in the weld.

It could, therefore, be helpful to provide a thermal-insulated multi-walled pipe for superconducting power transmission that prevents intrusion of external heat due to radiation and has excellent thermal insulation property without using a superinsulation and can be produced easily.

Solution to Problem

As a result of studies, we discovered that, by forming a coating layer containing a metal powder at a surface of at least one of the steel pipes constituting the thermal-insulated multi-walled pipe for superconducting power transmission, emissivity (radiation factor) can be reduced, and the thermal insulation property of the thermal-insulated multi-walled pipe for superconducting power transmission can be improved.

The present disclosure is based on these discoveries. We thus provide the following.

1. A thermal-insulated multi-walled pipe for superconducting power transmission, comprising: a superconducting cable; and a multi-walled pipe that houses the superconducting cable, wherein the multi-walled pipe is composed of a plurality of straight pipes, and at least one of the plurality of straight pipes has, at a surface thereof, a coating layer containing a metal powder.

2. The thermal-insulated multi-walled pipe for superconducting power transmission according to 1., wherein the metal powder is made of a metal having a sacrificial corrosion protection effect.

3. The thermal-insulated multi-walled pipe for superconducting power transmission according to 1. or 2., wherein a thickness of the coating layer is 10 μm or more, and a content of the metal powder in the coating layer is 35 mass % to 98 mass %.

4. The thermal-insulated multi-walled pipe for superconducting power transmission according to any one of 1. to 3., wherein a resin coating layer is provided at an outer surface of an outermost straight pipe of the plurality of straight pipes.

Advantageous Effect

It is thus possible to prevent intrusion of external heat due to radiation and improve the thermal insulation property of the thermal-insulated multi-walled pipe for superconducting power transmission without using a superinsulation. The thermal-insulated multi-walled pipe for superconducting power transmission according to the present disclosure, despite being able to be produced by a simple method as compared with conventional techniques using hot-dip coating and the like, has emissivity reduced to the same level as conventional thermal-insulated multi-walled pipes for superconducting power transmission. In addition, the coating layer containing the metal powder in the present disclosure can be formed easily without requiring a large-scale line, unlike a metal coating formed by a method such as coating or vapor deposition. Thus, the presently disclosed technique has excellent responsiveness on the site and is also suitable for repair of welds.

DETAILED DESCRIPTION

A method according to one of the disclosed embodiments will be described in detail below with reference to the drawings. The following description merely concerns one of the preferred embodiments according to the present disclosure, and the present disclosure is not limited by the following description.

Figure 1:
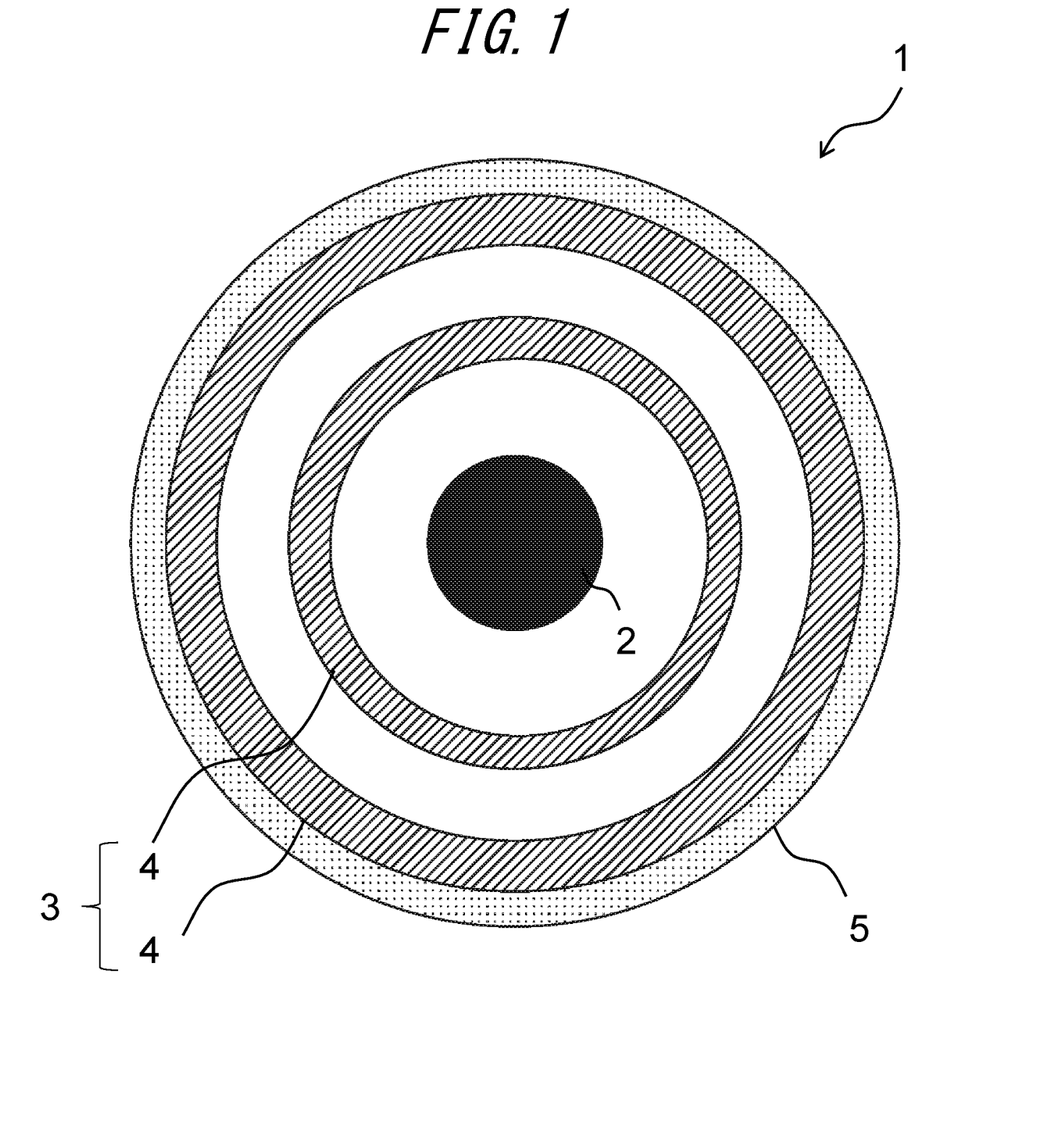
FIG. 1 is a sectional view of a thermal-insulated multi-walled pipe according to one of the disclosed embodiments.

As shown in FIG. 1, a thermal-insulated multi-walled pipe 1 for superconducting power transmission according to the present disclosure includes a superconducting cable 2 and a multi-walled pipe 3 that houses the superconducting cable 2. The structure of each component will be described below.

[Superconducting Cable]

The superconducting cable 2 may be any cable that can be used for superconducting power transmission. An example of a superconducting cable 2 suitable for such use is a superconducting cable including a core (former) made of a metal such as copper, an insulation layer, and a conductor made of a superconducting material. The superconducting material may be any superconducting material, but is preferably a high-temperature superconducting material that can reach superconducting state in a liquid nitrogen environment.

[Multi-Walled Pipe]

The superconducting cable 2 is housed in the multi-walled pipe 3 composed of a plurality of straight pipes. The multi-walled pipe 3 may be a double pipe composed of two straight pipes, or may be composed of three or more straight pipes. The superconducting cable 2 is typically housed inside the innermost pipe of the plurality of straight pipes constituting the multi-walled pipe. When using the thermal-insulated multi-walled pipe 1 for superconducting power transmission in actual power transmission, a coolant for cooling the superconducting cable 2 is flown into the pipe (typically, the innermost pipe) housing the superconducting cable 2. As the coolant, for example, liquid nitrogen may be used. The multi-walled pipe 3 may optionally further include an additional pipe (or pipes). For example, a double pipe composed of an outer pipe and an inner pipe may further include, in the outer pipe, an additional pipe independent of the inner pipe.

In the present disclosure, it is important to form the multi-walled pipe using only straight pipes 4, without using corrugated pipes or flexible pipes. A straight pipe has a smaller surface area per unit length than a corrugated pipe or a flexible pipe, and therefore can prevent intrusion of external heat. The term "straight pipe" herein denotes not a pipe formed in a wave shape such as a corrugated pipe or a flexible pipe but a pipe having a substantially constant cross-sectional area, and encompasses a straight pipe subjected to bending. The shape of the straight pipe 4 in a section perpendicular to the longitudinal direction is preferably circular.

The material of each straight pipe 4 is not limited, but is preferably a metal. As the metal, for example, one or more selected from the group consisting of aluminum, an aluminum alloy, iron, steel, a Ni-based alloy, and a Co-based alloy is preferably used. In particular, the straight pipe is preferably a straight steel pipe, in terms of strength, corrosion resistance, cost, etc. The material of the straight steel pipe 4 is preferably one or both of carbon steel and stainless steel. The plurality of straight pipes 4 constituting the multi-walled pipe 3 may be made of the same material or different materials.

Of the plurality of straight pipes 4 constituting the multi-walled pipe 3, the material of the straight pipe (hereafter referred to as "cable-housing pipe") that directly houses the superconducting cable 2 is preferably a steel material whose volume fraction of austenite phase is 80% or more. Two main reasons for this are as follows. One reason is that a steel material having a microstructure mainly composed of austenite has excellent elongation. For example, when winding the multi-walled pipe around a reel barge to lay the pipe, a pipe on the inner side of the plurality of straight pipes constituting the multi-walled pipe is deformed more greatly, due to the differences in bending radius. A steel material whose volume fraction of austenite phase is 80% or more has excellent elongation, and is therefore suitable as the material of the cable-housing pipe located on the inner side. The other reason is that a steel material having a microstructure mainly composed of austenite has excellent low-temperature toughness. Since the coolant such as liquid nitrogen flows in the cable-housing pipe, a steel material whose volume fraction of austenite phase is 80% or more is suitable in terms of strength and toughness at low temperature.

The steel material whose volume fraction of austenite phase is 80% or more may be any steel material satisfying the condition. The volume fraction of austenite is preferably 90% or more. No upper limit is placed on the volume fraction of austenite, and the upper limit may be 100%. Examples of the steel material whose volume fraction of austenite phase is 80% or more include austenitic stainless steel and an austenitic steel material containing Mn (i.e., high manganese steel). The Mn content in the high manganese steel is preferably 11 mass % or more. As the austenitic stainless steel, SUS316L is preferable.

In the case of using a straight steel pipe as the straight pipe 4, a steel pipe produced by any method may be used as the straight steel pipe. Examples of the steel pipe suitable for use include an electric-resistance-welded pipe, a seamless pipe, and a UOE pipe. The straight steel pipe 4 may be optionally subjected to a surface treatment. As the surface treatment, for example, one or more selected from the group consisting of pickling, electropolishing, and chemical polishing is preferably performed.

Total Thickness

The thickness of each of the plurality of straight pipes 4 constituting the multi-walled pipe 3 may independently be any value. The total thickness of the plurality of straight pipes 4 is preferably 10 mm or more, and more preferably 15 mm or more. If the total thickness is in such a range, when laying the thermal-insulated multi-walled pipe 1 for superconducting power transmission on the sea bottom, the thermal-insulated multi-walled pipe 1 for superconducting power transmission sinks under its own weight. Thus, the thermal-insulated multi-walled pipe 1 for superconducting power transmission can be laid easily without using a weight and the like, and has such strength that can withstand water pressure and the like.

The thickness of each of the plurality of straight pipes 4 constituting the multi-walled pipe 3 is not limited, but is preferably 3 mm or more. The thickness of the outermost pipe of the plurality of straight pipes 4 constituting the multi-walled pipe 3 is more preferably 8 mm or more.

[Coating Layer Containing Metal Powder]

A coating layer 5 containing a metal powder (hereafter also simply referred to as "coating layer") is provided at a surface of at least one of the plurality of straight pipes 4 constituting the multi-walled pipe 3. By providing the coating layer 5 containing the metal powder, the emissivity of the straight pipe surface, in particular, the emissivity in a far-infrared region, can be reduced. Consequently, intrusion of external heat due to radiation of far-infrared rays or the like can be prevented, and the thermal insulation property of the thermal-insulated multi-walled pipe 1 for superconducting power transmission can be improved.

(Metal Powder)

The metal powder is not limited and may be a powder made of any metal (including an alloy). In terms of improving corrosion resistance, a powder made of a metal having a sacrificial corrosion protection effect is preferable as the metal powder. Examples of metals having a sacrificial corrosion protection effect that can be preferably used include Zn, Al, and Mg, and alloys containing at least one of these elements. In particular, the metal powder more preferably contains one or both of zinc powder and zinc alloy powder.

When the content of the metal powder in the coating layer, i.e., the proportion of the mass of the metal powder to the mass of the whole coating layer, is higher, the emissivity reduction effect by the metal powder is higher. Accordingly, the content of the metal powder is preferably 35 mass % or more, more preferably 50 mass % or more, and further preferably 70 mass % or more. If the content of the metal powder is excessively high, the adhesion of the coating layer decreases. Accordingly, the content of the metal powder is preferably 98 mass % or less, and more preferably 95 mass % or less.

(Binder)

The coating layer 5 may further contain a binder, in addition to the metal powder. The binder may be one or both of an organic binder and an inorganic binder, without being limited thereto.

The organic binder may be any organic resin, without being limited thereto. As the organic resin, for example, one or more selected from the group consisting of epoxy resin, polystyrene resin, and fluorine-based resin may be used. The coating layer containing the organic binder has better construction workability and adhesion than the coating layer containing the inorganic binder.

The inorganic binder may be, for example, an alkyl silicate. An example of the alkyl silicate is ethyl silicate. Since the inorganic binder is not decomposed by ultraviolet rays or the like, the coating layer containing the inorganic binder has better atmospheric corrosion resistance than the coating layer containing the organic binder.

The coating layer 5 containing the metal powder is provided on at least one of the plurality of straight pipes 4 constituting the multi-walled pipe 3. The coating layer 5 containing the metal powder may be provided at all of the plurality of straight pipes 4 constituting the multi-walled pipe 3. Each straight pipe 4 may have the coating layer 5 containing the metal powder at one or both of its outer surface and inner surface. Particularly in the case where a powder made of a metal having a sacrificial corrosion protection effect is used as the metal powder, by providing the coating layer 5 containing the metal powder at the outer surface of the outermost pipe that comes into contact with the external environment, the corrosion resistance of the thermal-insulated multi-walled pipe 1 for superconducting power transmission can be improved more effectively by the sacrificial corrosion protection effect of the metal powder.

When the ratio ($S2/S1$) (hereafter referred to as "coating area ratio") of the area $S2$ of the coating layer 5 containing the metal powder at the surface of the straight pipe 4 on which the coating layer 5 containing the metal powder is provided to the surface area $S1$ of the whose surface is higher, the emissivity reduction effect is higher. Therefore, the coating area ratio is preferably 70% or more, more preferably 90% or more, and further preferably 95% or more. The coating area ratio is preferably as high as possible, and the upper limit may be 100%. In the case where the coating layer 5 containing the metal powder is provided at both surfaces of one straight pipe 4, i.e., both of the outer and inner surfaces of one straight pipe 4, it is preferable that at least one of the coating area ratios at the outer and inner surfaces satisfies the foregoing condition, and more preferable that the coating area ratio at both surfaces satisfies the foregoing condition.

The thickness of the coating layer is not limited, but is preferably 10 μm or more, more preferably 20 μm or more, and further preferably 40 μm or more, in terms of the emissivity reduction effect. The metal content and the thickness are the values of the coating layer after drying.

The method of forming the coating layer 5 containing the metal powder is not limited, and may be any method. For example, the coating layer 5 may be formed by applying a paint (for example, a zinc-rich paint) containing the metal powder, a solvent, and optionally a binder onto the surface of the steel pipe 4. The application method is not limited, and may be any method such as roll coating, spraying, brush coating, or dipping. After the application, one or both of drying and baking may be optionally performed. Specific conditions of the application, the drying, the baking, etc. may be selected depending on, for example, the types of the powder and binder used.

Before the formation of the coating layer 5, the surface of the straight pipe 4 at which the coating layer 5 is to be provided is preferably subjected to a pretreatment (surface treatment). As the pretreatment, for example, one or more of blasting, pickling, degreasing, reduction treatment, and the like are preferably performed. By performing such base treatment, rust, oil, and the like at the pipe surface can be removed to improve the adhesion of the coating layer 5. Moreover, with the blasting, the surface roughness of the pipe can be increased appropriately, and the adhesion of the coating layer 5 can be improved by an anchor effect. An example of the blasting is shot blasting. With the reduction treatment, an oxide layer at the pipe surface can be removed by reduction to expose the unoxidized surface. Particularly in the case of forming the below-described plated layer, the reduction treatment is preferably performed before the coating in order to improve the adhesion of the plated layer. The reduction treatment may be performed by any method. For example, a heat treatment may be performed in a reductive atmosphere. The heat treatment may be performed using an annealing furnace or the like.

[Plated Layer]

At least one of the plurality of straight pipes 4 constituting the multi-walled pipe 3 may have a plated layer at its surface. By using the coating layer 5 containing the metal powder and the plated layer in combination, the emissivity can be further reduced. The plated layer may be formed in a part (or parts) where the coating layer 5 containing the metal powder is not provided, and/or formed, as a base layer, underneath the coating layer 5 containing the metal powder.

The material of the plated layer is not limited, and may be any metal. Examples of the metal include zinc, a zinc alloy, aluminum, and an aluminum alloy. Examples of the method of forming the plated layer include hot-dip coating and electroplating.

For example, a coating layer 5 containing a powder made of a metal having a sacrificial corrosion protection effect is formed at the outer surface of the outermost pipe of the plurality of straight pipes 4 constituting the multi-walled pipe 3. Thus, the emissivity can be reduced, and the corrosion resistance can be improved by the sacrificial corrosion protection effect of the metal powder. Meanwhile, a plated layer such as a hot-dip aluminum-plated layer may be provided at the outer and inner surfaces of each straight pipe 4 other than the outermost pipe, i.e., a straight pipe 4 not in contact with the external corrosive environment. The aluminum-plated layer has both excellent emissivity reduction effect and excellent sacrificial corrosion protection effect, but it is difficult to coat a steel pipe with aluminum. By combining the coating layer 5 containing the metal powder and the aluminum-plated layer in this way, production becomes easier while improving the emissivity reduction effect more effectively.

[Resin Coating Layer]

Figure 2:
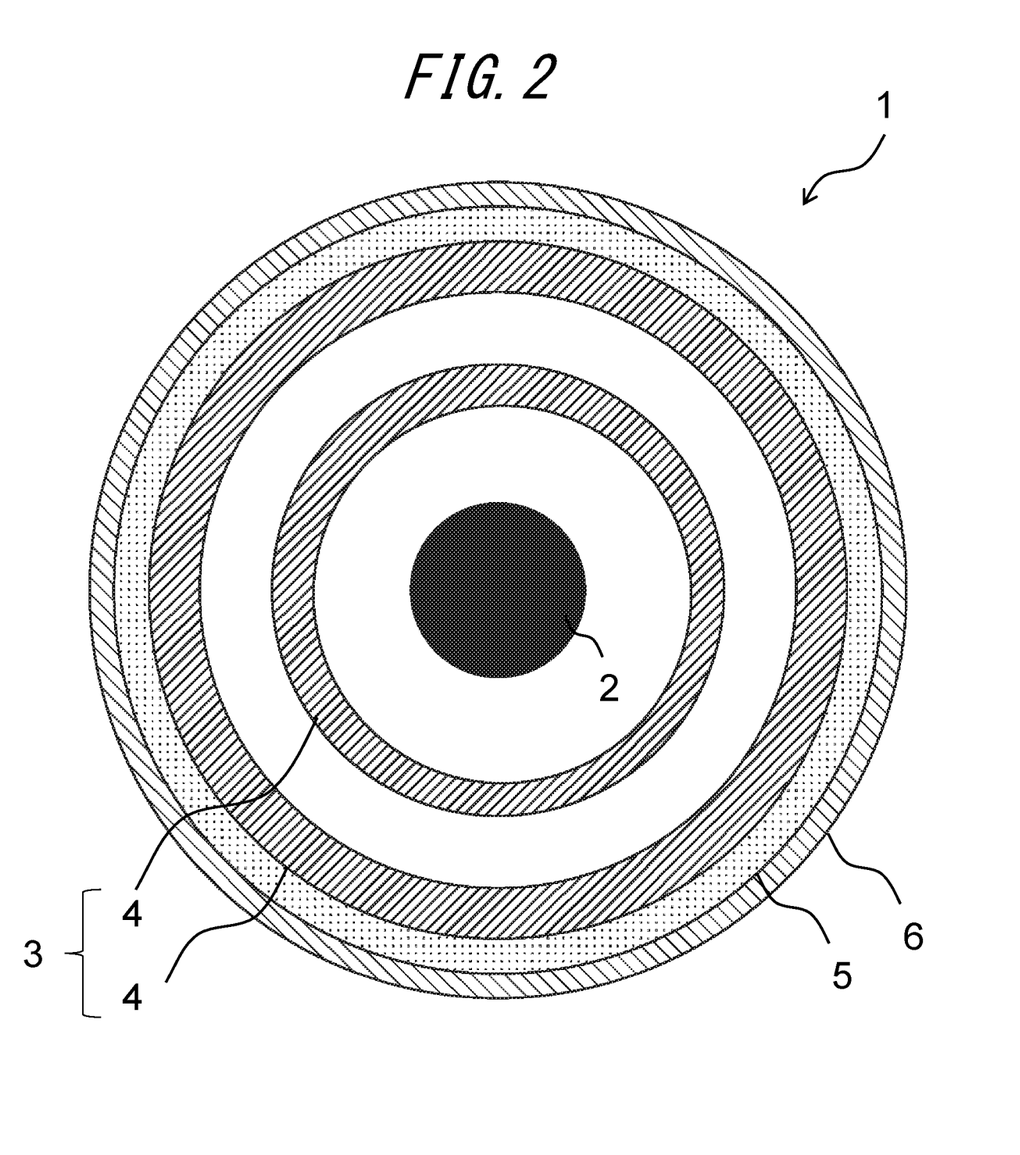
FIG. 2 is a sectional view of a thermal-insulated multi-walled pipe according to another one of the disclosed embodiments.

Furthermore, as shown in FIG. 2, a resin coating layer 6 may be provided at the outer surface of the outermost straight pipe of the plurality of straight pipes 4. By coating the surface with a resin, the corrosion resistance of the thermal-insulated multi-walled pipe 1 for superconducting power transmission can be improved to at least the same level as in the case of using a conventional metal coating. Particularly in the case where the thermal-insulated multi-walled pipe 1 for superconducting power transmission is buried in the ground, it is preferable to provide the resin coating layer. In the case where the coating layer 5 containing the metal powder is formed at the outer surface of the outermost straight pipe, the resin coating layer 6 is preferably formed on the coating layer 5 containing the metal powder.

The resin forming the resin coating layer 6 is not limited, and may be any resin. As the resin, for example, one or more selected from the group consisting of polyethylene resin, urethane resin, epoxy resin, and mixtures thereof is preferable, and polyethylene resin is more preferable.

As the polyethylene resin, one or both of a homopolymer of ethylene and a copolymer of ethylene and α-olefin are preferably used. Examples of the α-olefin include propylene, 1-butene, 1-pentene, 1-hexene, 4-methyl-1-pentene, 1-octene, and 1-decene. As the polyethylene resin, a high-density polyethylene resin with a density of 915 kg/m$^3$ or more is preferably used.

The method of forming the resin coating layer 6 is not limited, and may be any method. For example, molten resin may be extruded using a round die or a T die to cover the outside of the steel pipe. Alternatively, powder coating may be performed to cover the outside of the steel pipe with the resin. The thickness of the resin coating layer 6 is preferably 0.1 mm or more, and more preferably 0.5 mm or more. The thickness of the resin coating layer 6 is preferably 3.0 mm or less, and more preferably 2.0 mm or less.

The resin coating layer 6 preferably does not contain a metal powder. The resin coating layer 6 may be a coating layer made only of resin.

[Spacer]

A spacer may be preferably placed between adjacent two straight pipes of the plurality of straight pipes 4 constituting the multi-walled pipe 3. By providing the spacer, the adjacent two pipes are kept from being in direct contact with each other, so that direct heat conduction can be prevented. A plurality of spacers is preferably arranged at a spacing in the longitudinal direction of the thermal-insulated multi-walled pipe for superconducting power transmission. The term "adjacent" herein denotes a state in which one of two pipes is located inside the other one of the two pipes and there is no other pipe between the two pipes.

The shape of the spacer is not limited. For example, a sheet-shaped spacer having a through-hole in the thickness direction at the center is preferable. By passing the inner straight pipe of the adjacent two straight pipes through the through-hole, the spacer can be stably placed between the adjacent two straight pipes.

In terms of reducing the contact area between the steel pipe and the spacer, the cross-sectional shape of the spacer in a plane perpendicular to the longitudinal direction of the thermal-insulated multi-walled pipe for superconducting power transmission is preferably a polygon. The polygon may be any polygon with three or more vertices. Examples include a triangle, a quadrangle, a pentagon, and a hexagon. The polygon is not limited to a regular polygon. For example, as the quadrangle, not only a square but also a rectangle whose long side and short side differ in length may be used. The term "polygon" herein includes not only a geometrically perfect polygon but also a substantial polygon obtained by applying a minor change to a perfect polygon. For example, the shape of the spacer is regarded as the polygon even in the case where the corners of the spacer are round or flat due to wear, deformation, or the like.

The material of the spacer may be any material. In terms of low thermal conductivity and low friction coefficient, the material is preferably a resin, and more preferably a fluororesin. As the fluororesin, for example, one or more selected from the group consisting of polytetrafluoroethylene (PTFE), polyvinylidene fluoride (PVDF), polyvinyl fluoride (PVF), and polychlorotrifluoroethylene (PCTFE) may be used. To improve the strength of the spacer, a fiber reinforced plastic (FRP) obtained by adding a fibrous filler to the resin may be used. The FRP is, for example, a glass fiber reinforced plastic (GFRP). Other optional fillers may be added. However, if a filler is added, there is a possibility that the thermal conductivity of the spacer increases, and the thermal insulation property decreases. Hence, the resin used for the spacer preferably does not contain a filler, in terms of thermal insulation property.

The spacers may be arranged at any spacing in the longitudinal direction of the thermal-insulated multi-walled pipe for superconducting power transmission. The spacing may be regular spacing or irregular spacing. The spacing is not limited, and may be any value. If the spacing is excessively large, the contact between the pipes constituting the multi-walled pipe may not be prevented. The spacing is therefore preferably 10 m or less. If the spacing is excessively small, the spacer installation cost increases. The spacing is therefore preferably 1 m or more. Changes of the positions of the spacers in association with an operation such as pipe-laying are acceptable.

[Vacuum Insulation Layer]

The space between adjacent two straight pipes of the plurality of straight pipes 4 constituting the multi-walled pipe 3 may be decompressed to form a vacuum insulation layer. By providing the vacuum insulation layer, intrusion of external heat can be further prevented. The vacuum insulation layer may be formed when laying the thermal-insulated multi-walled pipe 1 for superconducting power transmission. That is, the vacuum insulation layer need not be formed in the thermal-insulated multi-walled pipe 1 for superconducting power transmission prior to laying. The vacuum insulation layer is preferably formed in the space where the spacer is located.

The vacuum insulation layer is formed by exhausting (vacuuming) the space between the adjacent two straight pipes. The exhaustion may be performed once after laying the thermal-insulated multi-walled pipe 1 for superconducting power transmission, or performed twice or more. For example, preliminary exhaustion (provisional vacuuming) is performed before laying, and exhaustion to the final vacuum (main vacuuming) is performed after laying.

EXAMPLES

To determine the effects of the coating layer containing the metal powder, samples were made according to the following procedure, and their emissivity was evaluated. While sheet samples were used here, the shape of the base material does not directly influence the emissivity, and thus the same effects can be achieved in the case of thermal-insulated multi-walled pipes, too.

First, steel sheets of 50 mm×100 mm were prepared as base steel sheets on which coating layers were to be formed. As the steel sheets, "SPCC" (steel plate cold commercial, commonly used cold-rolled steel plate) defined in JIS was used.

Next, after subjecting the surface of each base steel sheet to a pretreatment, a paint containing a metal powder in a dispersed state was applied to the surface of the base steel sheet, to form a coating layer containing the metal powder. The pretreatment and application method used and the types of the metal powder and binder contained in the paint used are shown in Table 1. The metal content (mass %), coating ratio (%), and thickness (μm) of the coating layer after drying are also shown in Table 1. The thickness is an average value of thicknesses at randomly selected 10 points in the vertical cross-section of the sample observed and measured using a microscope. The metal content was measured after peeling the coating layer and drying. The thickness of the coating layer was adjusted by changing the number of applications.

For some of the samples, after forming a hot-dip galvanized layer on the surface of the cold-rolled steel sheet, the coating layer was formed on the hot-dip galvanized layer (Nos. 4 and 10). For comparison, a sample of the steel sheet as cold-rolled with no coating layer (No. 2) and a sample of the cold-rolled steel sheet having a galvannealed layer formed at its surface (No. 1) were produced. For comparison, a coating layer not containing a metal powder was used in one sample (No. 17).

For each of the obtained samples, emissivity evaluation was performed by the following method.

(Emissivity)

The emissivity of the surface of the obtained samples was measured using a far-infrared spectroradiometer (JEOL Ltd., JIR-E500). The emissivity measurement was performed in a wavelength range of 4 μm to 25 μm, and the emissivity at wavelengths of 8 μm, 12 μm, 16 μm, and 20 μm omitting both ends containing noise was used for the evaluation.

The emissivity was evaluated based on the following evaluation criteria, using the following first conditions (1) to (4) which are preferable conditions and second conditions (5) to (8) which are more preferable conditions.

[First Conditions]
(1) Emissivity at wavelength of 8 μm: less than 8%.
(2) Emissivity at wavelength of 12 μm: less than 12%.
(3) Emissivity at wavelength of 16 μm: less than 15%.
(4) Emissivity at wavelength of 20 μm: less than 18%.

[Second Conditions]
(5) Emissivity at wavelength of 8 μm: less than 6%.
(6) Emissivity at wavelength of 12 μm: less than 9%.
(7) Emissivity at wavelength of 16 μm: less than 12%.
(8) Emissivity at wavelength of 20 μm: less than 14%.

[Evaluation criteria]
Not satisfying any of the first conditions (1) to (4): poor.
Satisfying part of the first conditions (1) to (4): unsatisfactory.
Satisfying all of the first conditions (1) to (4): satisfactory.
Satisfying all of the first conditions (1) to (4) and part of the second conditions (5) to (8): good.
Satisfying all of the second conditions (5) to (8): excellent.

The emissivity evaluation results are shown in Table 1. As can be understood from the results, by providing a coating layer containing a metal powder, emissivity can be reduced and intrusion of external heat into a thermal-insulated multi-walled pipe can be prevented.

TABLE 1

| | | | | Coating layer containing metal powder | | | | | |
|---|---|---|---|---|---|---|---|---|---|
| No. | Pretreatment | Plated layer | Binder | Metal content (mass %) | Coating area ratio (%) | Thickness (μm) | Application method | Emissivity | Remarks |
| 1 | — | Galvannealed layer | | Not formed | | | | Excellent | Comparative Example |
| 2 | — | — | | Not formed | | | | Poor | Comparative Example |
| 3 | Blasting | — | Ethyl silicate | Zn: 70% | 100 | 23 | Brush coating | Good | Example |
| 4 | Degreasing | Hot-dip galvanized layer | Ethyl silicate | Zn: 92% | 70 | 70 | Brush coating | Excellent | Example |
| 5 | Blasting | — | Fluorine-based resin | Zn: 85% | 100 | 48 | Spraying | Good | Example |
| 6 | Pickling | — | Urethane-based resin | Zn: 88% | 100 | 67 | Spraying | Good | Example |
| 7 | Pickling | — | Epoxy-based resin | Zn: 50% | 100 | 55 | Brush coating | Satisfactory | Example |
| 8 | Pickling | — | Epoxy-based resin | Zn: 35% | 100 | 15 | Brush coating | Satisfactory | Example |
| 9 | Grinding | — | Ethyl silicate | Zn: 80%, Al: 3%, Mg: 2% | 100 | 81 | Brush coating | Excellent | Example |
| 10 | Grinding | Hot-dip galvanized layer | Ethyl silicate resin | Zn: 74% | 65 | 75 | Brush coating | Satisfactory | Example |
| 11 | Pickling | — | Ethyl silicate | Zn: 85%, Al: 5% | 100 | 80 | Brush coating | Excellent | Example |
| 12 | Blasting | — | Ethyl silicate | Zn: 84% | 100 | 68 | Brush coating | Excellent | Example |
| 13 | Degreasing | — | Ethyl silicate | Zn: 78% | 100 | 55 | Brush coating | Good | Example |
| 14 | Degreasing | — | Epoxy-based resin | Zn: 84% | 100 | 94 | Brush coating | Excellent | Example |
| 15 | Degreasing | — | Epoxy-based resin | Zn: 94% | 100 | 48 | Brush coating | Good | Example |
| 16 | Degreasing | — | Silica composite emulsion resin | Zn: 70% | 100 | 57 | Brush coating | Good | Example |
| 17 | Degreasing | — | Epoxy-based resin | — | 100 | 78 | Brush coating | Poor | Comparative Example |

The invention claimed is:

1. A thermal-insulated multi-walled pipe for superconducting power transmission, comprising:
   a superconducting cable; and
   a multi-walled pipe that houses the superconducting cable,
   wherein the multi-walled pipe is composed of a plurality of straight pipes,
   at least one of the plurality of straight pipes has, at a surface thereof, a coating layer containing a metal powder, and
   a content of the metal powder in the coating layer is 35 mass % to 98 mass %.

2. The thermal-insulated multi-walled pipe for superconducting power transmission according to claim 1, wherein the metal powder is made of a metal having a sacrificial corrosion protection effect.

3. The thermal-insulated multi-walled pipe for superconducting power transmission according to claim 2, wherein a thickness of the coating layer is 10 μm or more.

4. The thermal-insulated multi-walled pipe for superconducting power transmission according to claim 3, wherein a resin coating layer is provided at an outer surface of an outermost straight pipe of the plurality of straight pipes.

5. The thermal-insulated multi-walled pipe for superconducting power transmission according to claim 2, wherein a resin coating layer is provided at an outer surface of an outermost straight pipe of the plurality of straight pipes.

6. The thermal-insulated multi-walled pipe for superconducting power transmission according to claim 1, wherein a thickness of the coating layer is 10 μm or more.

7. The thermal-insulated multi-walled pipe for superconducting power transmission according to claim 6, wherein a resin coating layer is provided at an outer surface of an outermost straight pipe of the plurality of straight pipes.

8. The thermal-insulated multi-walled pipe for superconducting power transmission according to claim 1, wherein a resin coating layer is provided at an outer surface of an outermost straight pipe of the plurality of straight pipes.

9. The thermal-insulated multi-walled pipe for superconducting power transmission according to claim 1, wherein a material of the straight steel pipe is one or both of carbon steel and stainless steel.

* * * * *

UNITED STATES PATENT AND TRADEMARK OFFICE
CERTIFICATE OF CORRECTION

PATENT NO. : 10,971,286 B2  
APPLICATION NO. : 16/614800  
DATED : April 6, 2021  
INVENTOR(S) : Yasuhide Ishiguro et al.

Page 1 of 1

It is certified that error appears in the above-identified patent and that said Letters Patent is hereby corrected as shown below:

On the Title Page

In the FOREIGN PATENT DOCUMENTS on page 2:
Line 4, please delete "JP H10316445 A" and insert --JP H10318445 A--.

In the OTHER PUBLICATIONS on page 2:
Lines 3-6, please delete "Jun. 25, 2019, Notification of Reasons for Refusal issued by the Japan Patent Office in the corresponding Japanese Application No. 2018-544576 with English language Concise Statement of Relevance Patent." and insert --Jun. 25, 2019, Notification of Reasons for Refusal issued by the Japan Patent Office in the corresponding Japanese Patent Application No. 2018-544576 with English language Concise Statement of Relevance.--.

Signed and Sealed this  
Twenty-seventh Day of July, 2021

Drew Hirshfeld  
*Performing the Functions and Duties of the*  
*Under Secretary of Commerce for Intellectual Property and*  
*Director of the United States Patent and Trademark Office*